United States Patent
Park et al.

(10) Patent No.: US 7,675,492 B2
(45) Date of Patent: Mar. 9, 2010

(54) DISPLAY DEVICE AND DRIVING METHOD THEREOF

(75) Inventors: Jong-Woung Park, Seongnam-si (KR);
Joo-Hyung Lee, Gwacheon-si (KR);
Kee-Han Uh, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 945 days.

(21) Appl. No.: 11/448,577

(22) Filed: Jun. 7, 2006

(65) Prior Publication Data
US 2006/0279490 A1   Dec. 14, 2006

(30) Foreign Application Priority Data
Jun. 10, 2005   (KR) .................. 10-2005-0049952

(51) Int. Cl.
G09G 3/30   (2006.01)
G09G 3/32   (2006.01)

(52) U.S. Cl. .................. 345/77; 345/82; 345/83; 345/87; 345/88; 345/690

(58) Field of Classification Search .................. 345/55, 345/76, 77, 82, 83, 84, 87, 88, 204, 205, 345/690; 348/739, 790, 791, 800, 801, 802
See application file for complete search history.

(56) References Cited
U.S. PATENT DOCUMENTS 6,801,220 B2 * 10/2004 Greier et al. ................. 345/694
2005/0179625 A1 * 8/2005 Choi et al. ................... 345/76
2006/0125810 A1 * 6/2006 Lee ............................ 345/204

FOREIGN PATENT DOCUMENTS

| CN | 1409404 | 4/2003 |
|---|---|---|
| JP | 11-282420 | 10/1999 |
| JP | 11-352920 | 12/1999 |
| JP | 2003-173162 | 6/2003 |
| JP | 2003-295821 | 10/2003 |
| JP | 2004-045648 | 2/2004 |
| JP | 2004-145069 | 5/2004 |
| JP | 2004-287345 | 10/2004 |
| JP | 2005-017420 | 1/2005 |
| JP | 2005-037783 | 2/2005 |
| JP | 2005-055800 | 3/2005 |
| KR | 2002-051701 | 6/2002 |
| KR | 2002-0076799 | 10/2002 |
| KR | 2002-0094601 | 12/2002 |
| KR | 2004-092617 | 11/2004 |

* cited by examiner

Primary Examiner—My-Chau T Tran
(74) Attorney, Agent, or Firm—F. Chau & Associates, LLC

(57) ABSTRACT

A display device includes: a plurality of pixels; a signal controller generating data accumulations for current image data for the pixels based on an accumulation of input image data, calculating modification coefficients according to the data accumulations, and modifying the current input image data based on the modification coefficients to generate modified image data; and a data driver generating data voltages corresponding to the modified image data and supplying the data voltages to the pixels.

13 Claims, 5 Drawing Sheets

DISPLAY DEVICE AND DRIVING METHOD THEREOF

CROSS-REFERENCE RELATED APPLICATION

This Application claims priority from a Korean patent application number 10-2005-0049952 filed on Jun. 10, 2005, and all the benefits accruing therefrom under 35 U.S.C. §119, the contents of which are incorporated by reference herein in its entirety.

BACKGROUND OF THE INVENTION (a) Technical Field

The present disclosure relates to a display device and a driving method thereof, and in particular, to an organic light emitting diode display and a driving method thereof.

(b) Discussion of Related Art

Recent trends toward light-weight and thin personal computers and televisions sets also require light weight and thin display devices, and flat panel displays satisfying such a requirement are being substituted for conventional cathode ray tubes (CRT).

The flat panel displays include a liquid crystal display (LCD), field emission display (FED), organic light emitting diode (OLED) display, plasma display panel (PDP), and so on.

Generally, an active matrix flat panel display includes a plurality of pixels arranged in a matrix and displays images by controlling the luminance of the pixels based on given luminance information. An OLED display is a self-emissive display device that displays image by electrically exciting light emitting organic material, and it has low power consumption, wide viewing angle, and fast response time, thereby being advantageous for displaying motion images.

A pixel of an OLED display includes an OLED and a driving thin film transistor (TFT) including polysilicon or amorphous silicon.

An OLED and an amorphous silicon driving transistor become degraded after a long-time driving, and this deteriorates the image quality of the OLED display and reduces the life time thereof.

Accordingly, several pixel circuits for reducing or compensating for the degradation of the OLED or the driving TFT are suggested. However, each of such pixel circuits includes three or more transistors and signal lines so as to decrease the aperture ratio. In addition, the degree of compensation decreases as time goes by.

SUMMARY OF THE INVENTION

A display device according to an exemplary embodiment of the present invention includes: a plurality of pixels; a signal controller generating data accumulations for current image data for the pixels based on an accumulation of input image data, calculating modification coefficients according to the data accumulations, and modifying the current input image data based on the modification coefficients so as to generate modified image data; and a data driver generating data voltages corresponding to the modified image data and supplying the data voltages to the pixels.

The signal controller may modulate the input image data such that each of the modulated image data has one of a predetermined number of levels. The signal controller may accumulate the modulated image data or the input image data to generate the data accumulations, and the signal controller may accumulate the modulated image data or the input image data at a predetermined interval.

The signal controller may include: a frame buffer storing buffer data for the pixels; and a level encoder modulating the input image data at a predetermined interval such that the modulated image data has one of a predetermined number of levels, adding the modulated image data into previous buffer data stored in the frame buffer to generate current buffer data, and supplying the current buffer data to the frame buffer.

The signal controller may further include a register storing a base value for the data accumulations. The level encoder may subtract a predetermined level from the buffer data stored in the frame buffer and may accumulate a value corresponding to the predetermined level into the base value stored in the register, when the buffer data are equal to or larger than the predetermined level.

The signal controller may further include a level decoder generating the data accumulations based on the buffer data from the frame buffer and the base value from the register.

The signal controller may further include a frame counter enabling the level encoder at the predetermined interval.

At least one of the frame buffer, the register, and the frame counter may include a nonvolatile memory.

The modification coefficients may be predetermined as a function of the data accumulations.

The signal controller may include: a lookup table storing modification variables; and an image signal modifier calculating the modification coefficients based on the modification variables supplied from the lookup table and generating the modified image data based on the modification coefficients.

The pixels may represent at least three primary colors and the modification coefficients for the at least three primary colors may be independently determined.

The display device may further include a plurality of scanning lines and a plurality of data lines intersecting the scanning lines. Each of the pixels may include a switching transistor connected to one of the scanning lines and one of the data lines, a capacitor connected to the switching transistor, a driving transistor connected to the switching transistor, and a light emitting element coupled to the driving transistor.

The modification coefficients may be represented as a function of at least one of a current efficiency of the light emitting element, an electron mobility of the driving transistor, and a threshold voltage of the driving transistor.

A method of driving a display device including a pixel is provided, which includes: generating a data accumulation based on input image data; calculating a modification coefficient corresponding to the data accumulation; modifying a current image data based on the modification coefficient to generate a modified image data; and generating a data voltage corresponding to the modified image data; and supplying the data voltage to the pixel.

The generation of the data accumulation may include: modulating the input image data at a predetermined interval such that each of the modulated image data has one of a predetermined number of values; and accumulating the modulated image data.

The method may further include: predetermining the modification coefficient for the data accumulation.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EMBODIMENTS

Referring to FIGS. 1, 2, 3 and 4, an organic light emitting diode (OLED) display according to an embodiment of the present invention will be described in detail.

Figure 1:
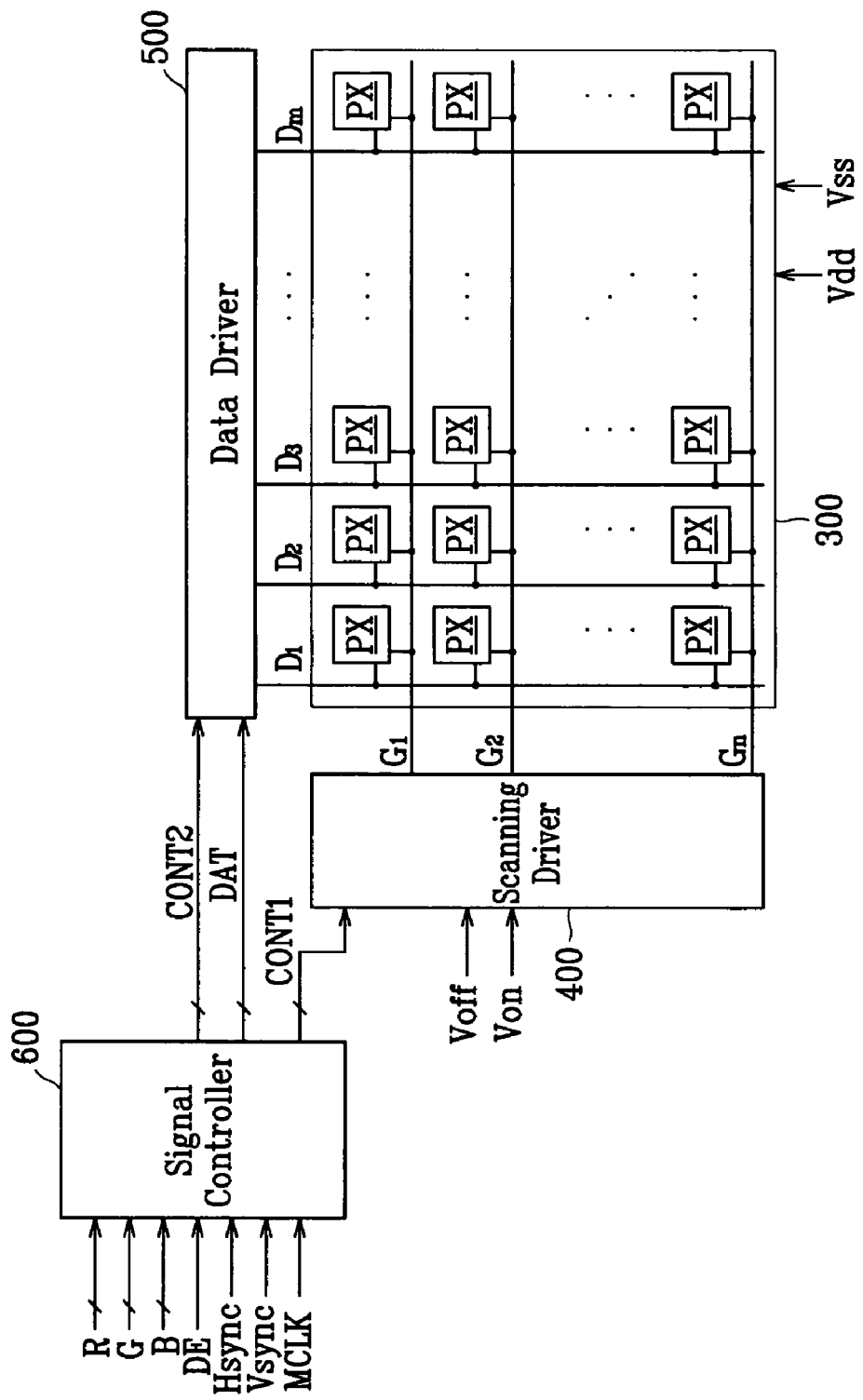
FIG. 1 is a block diagram of an OLED display according to an embodiment of the present invention.
Figure 2:
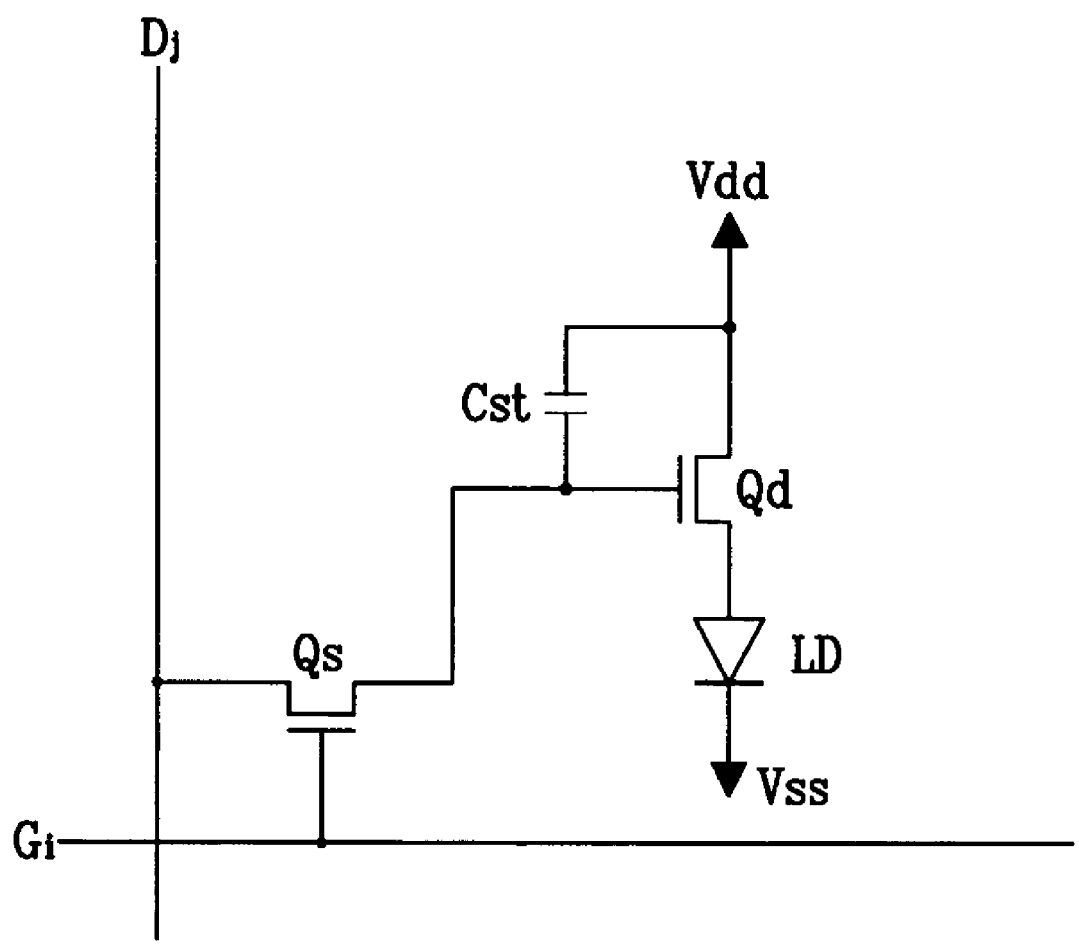
FIG. 2 is an equivalent circuit diagram of a pixel of an OLED display according to an embodiment of the present invention.

FIG. 1 is a block diagram of an OLED display according to an embodiment of the present invention and FIG. 2 is an equivalent circuit diagram of a pixel of an OLED display according to an embodiment of the present invention.

Referring to FIG. 1, an OLED display according to an embodiment includes a display panel 300, a scanning driver 400 and a data driver 500 that are connected to the display panel 300, and a signal controller 600 controlling the above elements.

The display panel 300 includes a plurality of signal lines $G_1$-$G_n$ and $D_1$-$D_m$, a plurality of voltage lines (not shown), and a plurality of pixels PX connected thereto and arranged substantially in a matrix.

The signal lines include a plurality of scanning lines $G_1$-$G_n$ transmitting scanning signals and a plurality of data lines $D_1$-$D_m$ transmitting data voltages. The scanning lines $G_1$-$G_n$ extend substantially in a row direction and substantially parallel to each other, while the data lines $D_1$-$D_m$ extend substantially in a column direction and substantially parallel to each other.

Each of the voltage lines transmits first and second driving voltages Vdd, etc.

Referring to FIG. 2, each pixel PX, for example, a pixel connected to a scanning line $G_i$ (i=1, 2, . . . , n) and a data line $D_j$ includes an OLED LD, a driving transistor Qd, a capacitor Cst, and a switching transistor Qs.

The switching transistor Qs has a control terminal, an input terminal, and an output terminal. The control terminal of the switching transistor Qs is connected to the scanning line $G_i$, and the input terminal of the switching transistor Qs is connected to the data line $D_j$. The output terminal of the switching transistor Qs is connected to the driving transistor Qd.

The driving transistor Qd also has a control terminal, an input terminal, and an output terminal. The control terminal of the driving transistor Qd is connected to the output terminal of the switching transistor Qs, and the input terminal of the driving transistor Qd is connected to the driving voltage Vdd. The output terminal of the driving transistor Qd is connected to the OLED LD.

The capacitor Cst is connected between the control terminal and the input terminal of the driving transistor Qd. The capacitor Cst stores the data voltage applied to the control terminal of the driving transistor Qd and maintains the stored voltage after the switching transistor Qs turns off.

The OLED LD has an anode connected to the output terminal of the driving transistor Qd and a cathode connected to a common voltage Vss. The OLED LD emits light having an intensity depending on a current $I_{LD}$ supplied from the driving transistor Qd, thereby displaying an image. The magnitude of the current $I_{LD}$ depends on the voltage difference between the control terminal and the output terminal of the driving transistor Qd.

The switching transistor Qs and the driving transistor Qd are n-channel field effect transistors (FETs) including amorphous silicon or polysilicon. However, at least one of the transistors Qs and Qd may be p-channel FETs. The connection relationship among the transistors Qs and Qd, the capacitor Cst, and the OLED LD may be interchanged.

Now, a structure of an OLED LD and a driving transistor Qd connected thereto shown in FIG. 2 will be described in detail with reference to FIGS. 3 and 4.

Figure 3:
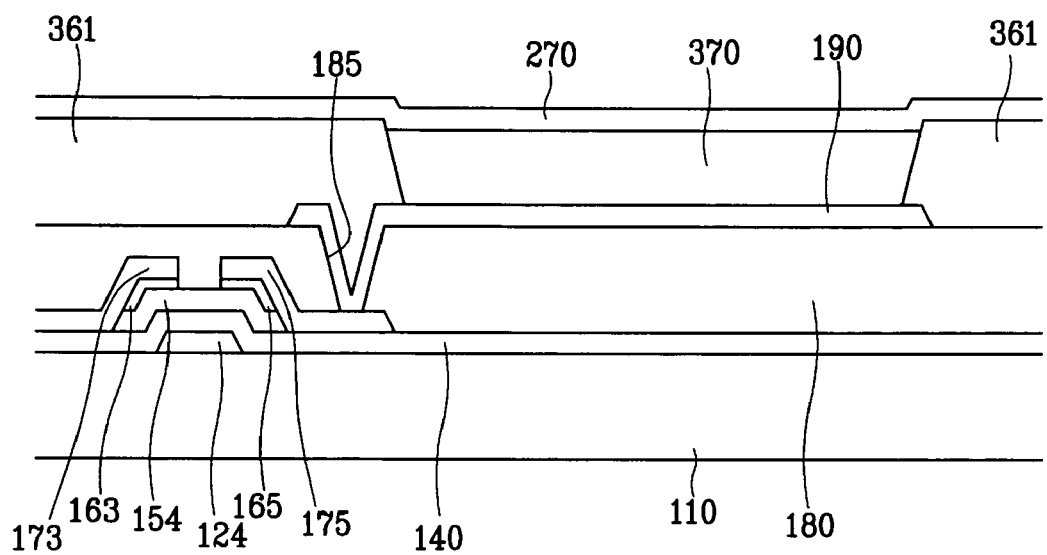
FIG. 3 is an exemplary sectional view of an OLED LD and a driving transistor Qd shown in FIG. 2.
Figure 4:
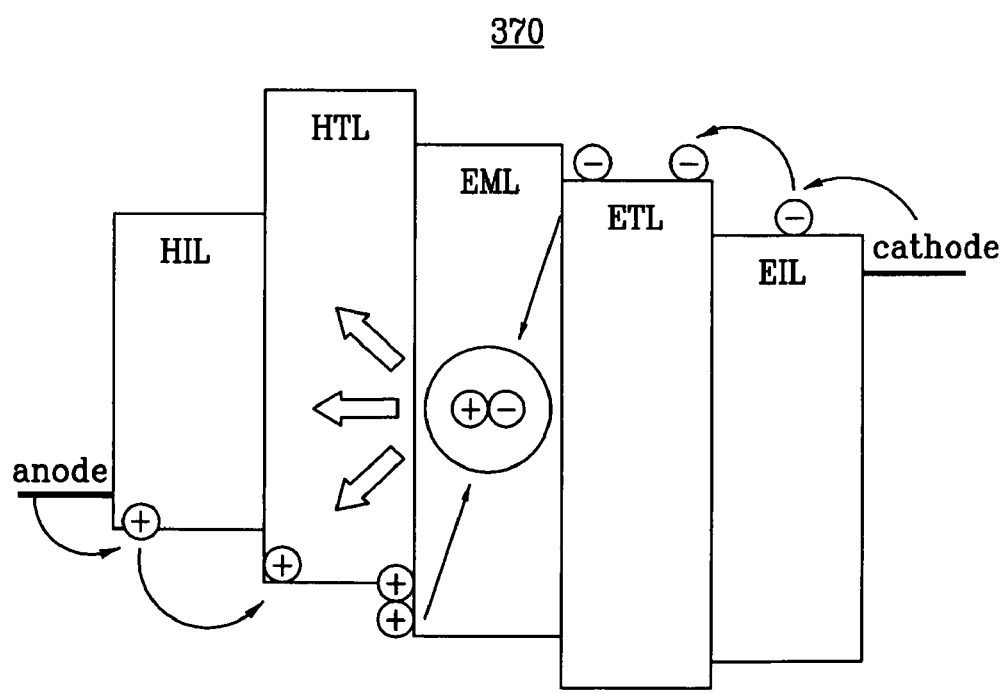
FIG. 4 is a schematic diagram of an OLED according to an embodiment of the present invention.

FIG. 3 is an exemplary sectional view of an OLED LD and a driving transistor Qd shown in FIG. 2 and FIG. 4 is a schematic diagram of an OLED according to an embodiment of the present invention.

A control electrode 124 is formed on an insulating substrate 110. The control electrode 124 is preferably made of an Al containing metal such as Al and Al alloy, an Ag containing metal such as Ag and Ag alloy, a Cu containing metal such as Cu and Cu alloy, an Mo containing metal such as Mo and Mo alloy, Cr, Ti or Ta. The control electrode 124 may have a multi-layered structure including two films having different physical characteristics. One of the two films is preferably made of low resistivity metal including an Al containing metal, an Ag containing metal, and a Cu containing metal for reducing signal delay or voltage drop. The other filth is preferably made of material such as an Mo containing metal, Cr, Ta or Ti, which has good physical, chemical, and electrical contact characteristics with other materials such as indium tin oxide (ITO) or indium zinc oxide (IZO). Good examples of the combination of the two films are a lower Cr film and an upper Al (alloy) film and a lower Al (alloy) film and an upper Mo (alloy) film. However, the gate electrode 124 may be made of various metals or conductors. The lateral sides of the gate electrode 124 are inclined relative to a surface of the substrate 110, and the inclination angle thereof ranges between about 30-80 degrees.

An insulating layer 140 preferably made of silicon nitride (SiNx) is formed on the control electrode 124.

A semiconductor 154 preferably made of hydrogenated amorphous silicon (abbreviated to "a-Si") or polysilicon is formed on the insulating layer 140, and a pair of ohmic contacts 163 and 165 preferably made of silicide or n+ hydrogenated a-Si heavily doped with n type impurity such as phosphorous are formed on the semiconductor 154. The lateral sides of the semiconductor 154 and the ohmic contacts 163 and 165 are inclined relative to the surface of the substrate, and the inclination angles thereof are preferably in a range of about 30-80 degrees.

An input electrode 173 and an output electrode 175 are formed on the ohmic contacts 163 and 165 and the insulating layer 140. The input electrode 173 and the output electrode 175 are preferably made of refractory metal such as Cr, Mo, Ti, Ta or alloys thereof. However, they may have a multilayered structure including a refractory metal film (not shown) and a low resistivity film (not shown). Good examples of the multi-layered structure are a double-layered structure including a lower Cr/Mo (alloy) film and an upper Al (alloy) film and a triple-layered structure of a lower Mo (alloy) film, an intermediate Al (alloy) film, and an upper Mo (alloy) film. Like the gate electrode 124, the input electrode 173 and the output electrode 175 have inclined edge profiles, and the inclination angles thereof range about 30-80 degrees.

The input electrode 173 and the output electrode 175 are separated from each other and disposed opposite each other with respect to a gate electrode 124. The control electrode 124, the input electrode 173, and the output electrode 175 as well as the semiconductor 154 form a TFT serving as a driving transistor Qd having a channel located between the input electrode 173 and the output electrode 175.

The ohmic contacts 163 and 165 are interposed only between the underlying semiconductor stripes 151 and the overlying electrodes 173 and 175 thereon and reduce the contact resistance therebetween. The semiconductor 154 includes an exposed portion, which is not covered with the input electrode 173 and the output electrode 175.

A passivation layer 180 is formed on the electrode 173 and 175, the exposed portion of the semiconductor 154, and the insulating layer 140. The passivation layer 180 is preferably made of an inorganic insulator such as silicon nitride or silicon oxide, an organic insulator, or a low dielectric insulating material. The low dielectric material preferably has a dielectric constant lower than 4.0 and examples thereof are a-Si:C:O and a-Si:O:F formed by plasma enhanced chemical vapor deposition (PECVD). The organic insulator may have photosensitivity and the passivation layer 180 may have a flat surface. The passivation layer 180 may be made of material having flatness characteristics and photosensitivity. The passivation layer 180 may have a double-layered structure including a lower inorganic film and an upper organic film so that it may take advantage of the organic film as well as it may protect the exposed portions of the semiconductor 154. The passivation layer 180 has a contact hole 185 exposing a portion of the output electrode 175.

A pixel electrode 190 is formed on the passivation layer 180. The pixel electrode 190 is physically and electrically connected to the output terminal electrode 175 through the contact hole 185 and it is preferably made of a transparent conductor such as ITO or IZO or reflective metal such as Cr, Ag, Al and alloys thereof.

A partition 361 is formed on the passivation layer 180. The partition 361 encloses the pixel electrode 190 to define an opening on the pixel electrode 190 like a river bank, and it is preferably made of an organic or inorganic insulating material.

An organic light emitting member 370 is formed on the pixel electrode 190 and it is confined in the opening enclosed by the partition 361.

Referring to FIG. 4, the organic light emitting member 370 has a multilayered structure including an emitting layer EML and auxiliary layers for improving the efficiency of light emission of the emitting layer EML. The auxiliary layers include an electron transport layer ETL and a hole transport layer HTL for improving the balance of the electrons and holes and an electron injecting layer EIL and a hole injecting layer HIL for improving the injection of the electrons and holes. The auxiliary layers may be omitted.

A common electrode 270, shown in FIG. 3, supplied with a common voltage Vss is formed on the organic light emitting member 370 and the partition 361. The common electrode 270 is preferably made of reflective metal such as Ca, Ba, Al or Ag, or transparent conductive material such as ITO or IZO.

A combination of opaque pixel electrodes 190 and a transparent common electrode 270 is employed to a top emission OLED display that emits light toward the top of the display panel 300 of FIG. 1, and a combination of transparent pixel electrodes 190 and a opaque common electrode 270 is employed to a bottom emission OLED display that emits light toward the bottom of the display panel 300.

A pixel electrode 190, an organic light emitting member 370, and a common electrode 270 form an OLED LD having the pixel electrode 190 as an anode and the common electrode 270 as a cathode or vice versa. The OLED LD uniquely emits one of primary color lights depending on the material of the light emitting member 380. An exemplary set of the primary colors includes red, green, and blue and the display of images is realized by the addition of the three primary colors.

Referring to FIG. 1 again, the scanning driver 400 is connected to the scanning lines $G_1$-$G_n$ of the display panel 300 and synthesizes a high voltage Von for turning on the switching transistor Qs and a low voltage Voff for turning off the switching transistor Qs to generate scanning signals for application to the scanning lines $G_1$-$G_n$.

The data driver 500 is connected to the data lines $D_1$-$D_m$ of the display panel 300 and applies data voltages corresponding to image signals to the data lines $D_1$-$D_m$.

The signal controller 600 controls the scanning driver 400 and the data driver 500.

The scanning driver 400 or the data driver 500 may be implemented as an integrated circuit (IC) chip mounted on the display panel 300 or on a flexible printed circuit (FPC) film in a tape carrier package (TCP) type, which are attached to the display panel 300. Alternately, they may be integrated into the display panel 300 along with the signal lines $G_1$-$G_n$ and $D_1$-$D_m$ and the transistors Qd and Qs.

The signal controller 600 is supplied from an external graphics controller (not shown) with input image signals R, G and B and input control signals controlling the display thereof. The input image signals R, G and B contains luminance information of each pixel PX, and the luminance has a predetermined number of, for example, $1024(=2^{10})$, $256(=2^8)$ or $64(=2^6)$, grays. The input control signals include a vertical synchronization signal Vsync, a horizontal synchronization signal Hsync, a main clock MCLK, and a data enable signal DE.

After generating scanning control signals CONT1 and data control signals CONT2 and modifying the input image signals R, G and B to generate modified image signals DAT on the basis of the input control signals and the input image signals R, G and B, the signal controller 600 sends the scanning control signals CONT1 to the scanning driver 400, and the processed image signals DAT and the data control signals CONT2 to the data driver 500.

The scanning control signals CONT1 include a scanning start signal STV for instructing the scanning driver 400 to start scanning and at least one clock signal for controlling the output time of the high voltage Von. The scanning control signals CONT1 may further include an output enable signal OE for defining the duration of the high voltage Von.

The data control signals CONT2 include a horizontal synchronization start signal STH for informing the data driver 500 of the start of transmission of the digital image signals for a row of pixels PX, a load signal LOAD for instructing the data driver 500 to apply the analog data voltages to the data lines $D_1$-$D_m$, and a data clock signal HCLK.

Responsive to the data control signals CONT2 from the signal controller 600, the data driver 500 receives a packet of digital image signals DAT from the signal controller 600, converts the digital image signals into analog data voltages, and applies the data voltages to the data lines $D_1$-$D_m$.

The scanning driver 400 makes scanning signals equal to the high voltage Von in response to the scanning control signals CONT1 from the signal controller 600. Then, the switching transistors Qs connected to the scanning signal lines $G_1$-$G_n$ are turned on to apply the data voltages to the control terminals of the driving transistors Qd and the capacitors Cst.

The data voltages applied to the capacitors Cst are stored and maintained after the switching transistors Qs are turned off. The driving transistors Qd supplied with the data voltages turn on to generate driving currents $I_{LD}$ corresponding to the data voltages. The OLED LD emits light having an intensity corresponding to the driving current $I_{LD}$.

By repeating this procedure by a unit of a horizontal period that may be equal to a period of the horizontal synchronization Hsync and the data enable signal DE, all scanning lines $G_1$-$G_n$ are sequentially supplied with the high voltage Von, thereby applying the data voltages to all pixels for a frame.

Now, exemplary image signal modification according to embodiments of the present invention will be described in detail with reference to FIGS. 5 and 6.

Figure 5:
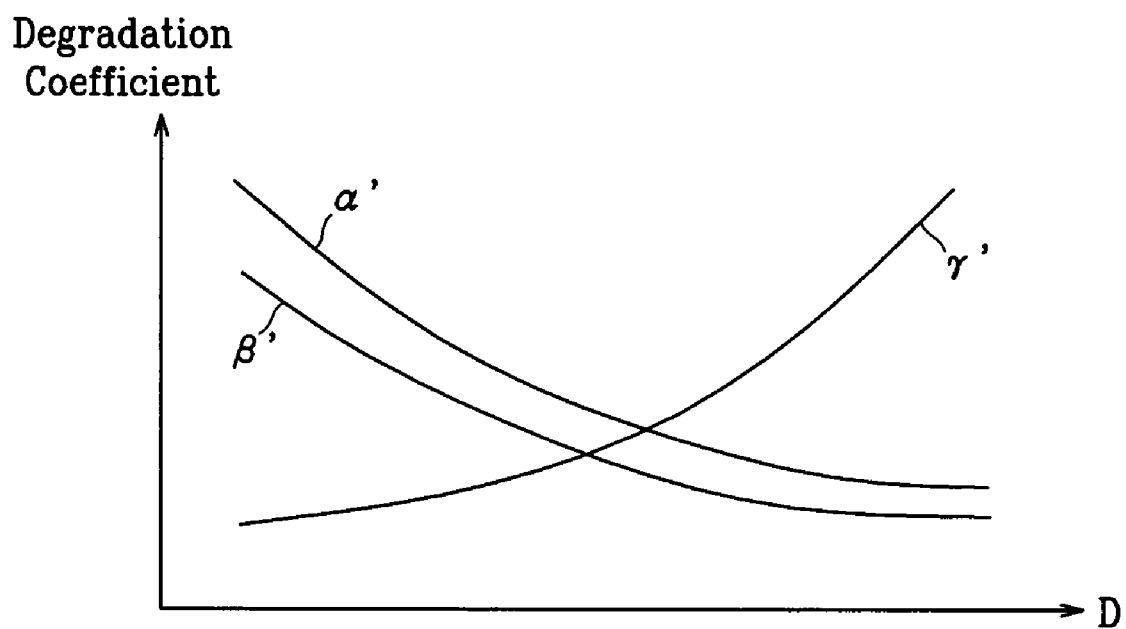
FIG. 5 is a graph schematically illustrating a degradation coefficient as function of data accumulation.
Figure 6:
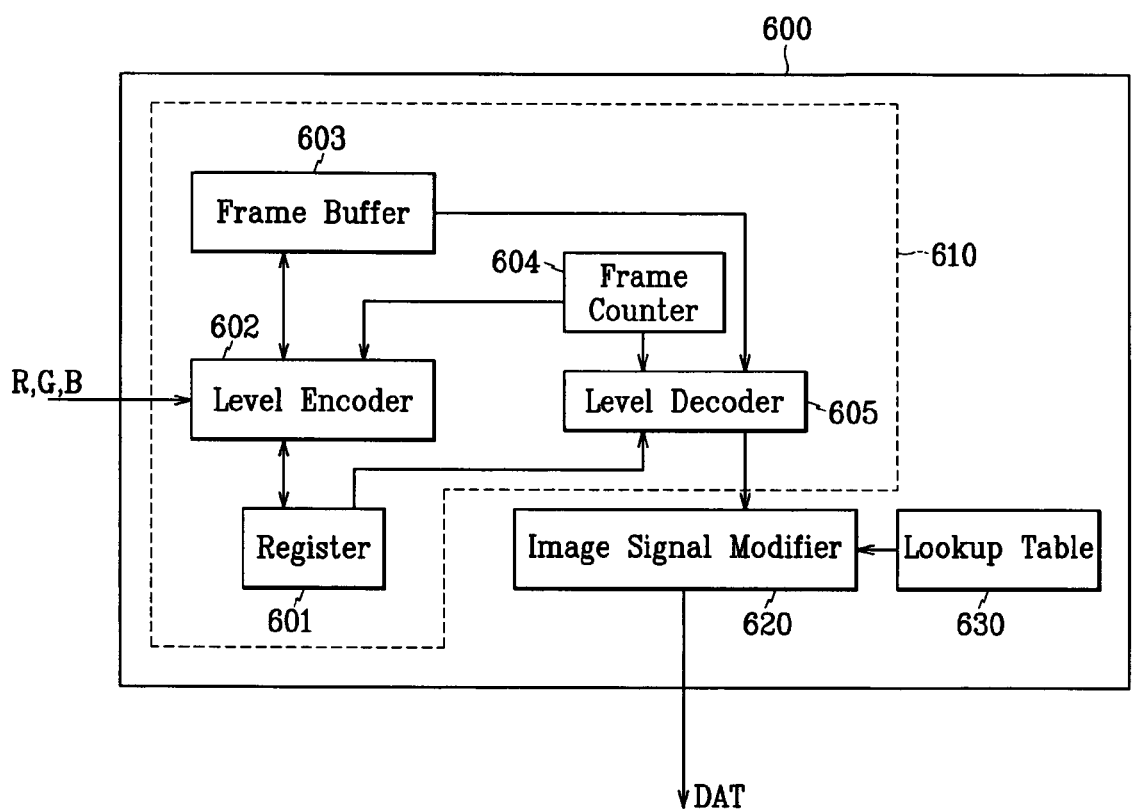
FIG. 6 is an exemplary block diagram of the signal controller of the OLED display shown in FIG. 1.

FIG. 5 is a graph schematically illustrating a degradation coefficient as a function of data accumulation, and FIG. 6 is an exemplary block diagram of the signal controller of the OLED display shown in FIG. 1.

When it is assumed that the luminance of the pixel PX shown in FIG. 2 is denoted by L, the luminance L is given by:

$$L = K \times \eta \times \mu \times (Vgs - Vth)^2. \quad (1)$$

Here, K is a constant representing characteristics of the pixel, which include the capacity, the length, and the width of the channel of a driving transistor Qd and the size of the channel. η is the current efficiency of the OLED LD, μ is the electron mobility of the driving transistor Qd, Vgs is a voltage difference between the control terminal and the output terminal of the driving transistor Qd, and Vth is the threshold voltage of the driving transistor Qd.

The current flowing in the driving transistor Qd and the OLED LD emits the OLED LD and simultaneously deteriorates the OLED LD. In detail, the current changes the current efficiency η, the electron mobility μ, and the threshold voltage Vth of the OLED LD.

The initial value of the current efficiency η of the OLED LD is denoted by $\eta_0$, the accumulation of the current in the OLED LD from the initial time to a predetermined time is denoted by S, and the degradation coefficient for the current efficiency η as function of the current accumulation S is denoted by α(S). Then, the current efficiency η(S) of the OLED LD is written by:

$$\eta(S) = \alpha(S) \times \eta_0. \quad (2)$$

Similarly, the electron mobility μ(S) of the driving transistor Qd is written by:

$$\mu(S) = \beta(S) \times \mu_0, \quad (3)$$

where $\mu_0$ denotes the initial value of the electron mobility μ of the driving transistor Qd and β(S) denotes the degradation coefficient for the electron mobility μ as function of the current accumulation S.

The threshold voltage Vth(S) of the driving transistor Qd can be also written by:

$$Vth(S) = \gamma(S) \times Vth_0, \quad (4)$$

where $Vth_0$ denotes the initial value of the threshold voltage Vth of the driving transistor Qd and γ(S) denotes the degradation coefficient as a function of the current accumulation S.

It is assumed that the initial value of the voltage Vgs shown in Eq. (1) is $Vgs_0$ ($=Vg_0-Vs_0$) and κ denotes a modification coefficient according to the degradation, where $Vg_0$ denotes an initial voltage of the control terminal of the driving transistor Qd and $Vs_0$ denotes an initial voltage of the output terminal thereof. The modified voltage Vgs' is given by:

$$Vgs' = \kappa \times Vg_0 - Vs_0. \quad (5)$$

In order to keep the luminance L of the pixel PX constant, from Eq. (1) to Eq. (5), $$K \times \alpha(S) \times \eta_0 \times \beta(S) \times \mu_0 33 \, [\kappa \times Vg_0 - Vs_0 - \gamma(S) \times Vth_0]^2 = K \times \eta_0 \times \mu_0 \times [Vgs_0 - Vth_0]^2. \quad (6)$$

Eq. (6) results in:

$$\kappa \times Vg_0 = \frac{Vgs_0 - Vth_0}{\sqrt{\alpha(S) \times \beta(S)}} + \gamma(S) \times Vth_0 + Vs_0 \quad (7)$$

$$= \frac{Vg_0 - Vs_0 - Vth_0}{\sqrt{\alpha(S) \times \beta(S)}} + \gamma(S) \times Vth_0 + Vs_0.$$

Here, it is noted that $Vs_0$ is determined by the threshold voltage of the OLED LD and the common voltage Vss.

Since the values α(S), β(S), γ(S), $Vth_0$, and $Vs_0$ can be determined by experiments, etc., the modification coefficient κ for keeping the luminance of the pixel constant regardless of the degradation of the OLED LD and the driving transistor Qd can be calculated.

In the meantime, since it is difficult for the OLED display to know the current accumulation S, the current accumulation S may be substituted with a data accumulation D that is obtained by accumulating the input image signals R, G and B. Since the current flowing in the OLED LD can be represented as a function of the input image signals R, G and B, the current accumulation S can be represented as a function of the data accumulation D and thus the degradation coefficients α(S), β(S) and γ(S) can be represented by α'(D), β'(D) and γ'(D), respectively. Accordingly, Eq. 7 becomes:

$$\kappa \times Vg_0 = \frac{Vg_0 - Vs_0 - Vth_0}{\sqrt{\alpha'(S) \times \beta'(S)}} + \gamma'(S) \times Vth_0 + Vs_0. \quad (8)$$

In FIG. 5, the degradation coefficients α' and β' decrease and the degradation coefficient γ' increases, as the data accumulation D increases.

Since the input image data R, G and B for respective pixels PX are different from each other, the data accumulations D for the respective pixels PX are also different and thus the degradation coefficients α'(D), β'(D) and γ'(D) for the respective pixels PX are different. As a result, the degradation coefficients α'(D), β'(D) and γ'(D) are predetermined by experiments, etc., and then the data accumulation D for each pixel PX is calculated to obtain a data voltage ($=\kappa \times Vg_0$) that is to be applied to the control terminal of the driving transistor Qd in the pixel PX. Then, a modified image data DAT for the input image data R, G and B for each pixel PX can be obtained from the data voltage.

In particular, since the current efficiency η of the OLED LD and the degree of the degradation thereof is different between red, green, and blue pixels, the degradation coefficient α'(D) for the current efficiency η may be determined differently for the pixels representing different colors so as to yield independently modified image data DAT for the different-color pixels.

Now, an exemplary signal controller according to an exemplary embodiment of the present invention will be described in detail with reference to FIG. 6.

Referring to FIG. 6, a signal controller according to this exemplary embodiment includes an image signal modifier 620, a data accumulation generator 610 coupled to the image signal modifier 620, and a lookup table 630 coupled to the image signal modifier 620.

The data accumulation generator 610 includes a level encoder 602, a level decoder 605, and a register 601, a frame buffer 603, and a frame counter 604 that are coupled to the level encoder 602 and the level decoder 605. The data accumulation generator 610 processes input image data R, G and B to generate a data accumulation D and outputs the data accumulation D to the image signal modifier 620.

The level encoder 602 receives the input image data R, G and B for each pixel PX and modulates the magnitude of the input image data R, G and B into at least one level. For example, the number of the modulation levels is four, two upper bits of the input image data R, G and B may be taken as the modulated data. The level encoder 602 adds the modulated data and a previous buffer data stored in the frame buffer 603 to generate current buffer data and supplies the current buffer data to the frame buffer 603.

In addition, the level encoder 602 determines whether the buffer data for all the pixels PX stored in the frame buffer 603 is equal to or larger than a predetermined level. When it is determined that all the buffer data is equal to or larger than the predetermined level, the level encoder 602 subtracts the predetermined level from all the buffer data and stores the subtracted buffer data into the frame buffer 603 as current buffer data.

Furthermore, the level encoder 602 adds a value corresponding to the predetermined level and a previous base value stored in the register 601 to generate a current base value and supplies the current base value to the register 601.

The frame buffer 603 stores buffer data related to the data accumulation D for each pixel PX supplied from the level encoder 602. The frame buffer 603 may include a nonvolatile memory.

The register 601 stores a base value related to the data accumulation D supplied from the level encoder 602. The register 601 may include a nonvolatile memory.

The frame counter 604 provides an enable signal for the level encoder 602 every predetermined number of frames to make the level encoder 602 operate. The predetermined number may be determined by experiments, etc.

It is noted that since the frame buffer 603 has a limited capacity, it may not infinitely store actual accumulated input image data R, G and B. Therefore, the accumulation of input image data R, G and B is performed at a predetermined interval defined by the frame counter 604, and in addition, modulated input image data instead of actual input image data R, G and B are accumulated.

The frame counter 604 counts and stores the number of the operations of the level encoder 602 and outputs the stored number to the level decoder 605. The frame counter 604 includes a nonvolatile memory.

The level decoder 605 calculates a data accumulation D from the base value supplied by the register 601, the buffer data supplied by the frame buffer 603, and the counting number supplied by the frame counter 604. Then, the level decoder 605 outputs the data accumulation D to the image signal modifier 620.

The lookup table 630 stores degradation coefficients $\alpha'(D)$, $\beta'(D)$ and $\gamma'(D)$, a threshold voltage $Vth_0$ of the driving transistor Qd, and an initial voltage $Vs_0$ of the output terminal of the driving transistor Qd as function of the data accumulation D, which are determined by experiments, etc.

The image signal modifier 620 receives input image data R, G and B for each pixel PX from an external device and converts the digital value of the input image data R, G and B into an analog value of a data voltage corresponding to the input image data. The image signal modifier 620 then receives the data accumulation D from the level decoder 605 and receives the degradation coefficients $\alpha'(D)$, $\beta'(D)$ and $\gamma'(D)$ and the voltages $Vth_0$ and $Vs_0$ corresponding thereto from the lookup table 630.

Since the size of the lookup table 630 may be limited, the lookup table 630 stores the data, that is, the degradation coefficients $\alpha'(D)$, $\beta'(D)$ and $\gamma'(D)$ and the voltages $Vth_0$ and $Vs_0$ only for a limited number of values of the data accumulation D, and the data for the remaining values of the data accumulation D can be calculated by interpolation, etc.

The image signal modifier 620 calculates a modified data voltage ($=\kappa \times Vd$) for a data voltage Vd based upon the degradation coefficients $\alpha'(D)$, $\beta'(D)$ and $\gamma'(D)$ and the voltages $Vth_0$ and $Vs_0$. Thereafter, the image signal modifier 620 converts the modified data voltage into a modified image data DAT.

The data accumulation generator 610 and the image signal modifier 620 can be implemented as digital logic.

According to an embodiment of the present invention, the degradation coefficients $\alpha'(D)$, $\beta'(D)$ and $\gamma'(D)$ may be calculated from the data accumulation D by the image signal modifier 620.

According to an embodiment of the present invention, each pixel PX may include three or more transistors or two or more capacitors Cst.

As described above, degradation coefficients obtained by accumulating image signals can provide modified image signals for appropriately compensating for the degradation of the OLED and the driving transistors regardless of the driving time thereof. In addition, the above-described configuration increases the aperture ratio since there is no need for additional transistors or other elements.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display device comprising:
a plurality of pixels;
a signal controller generating data accumulations for image data for the plurality of pixels based on accumulating input image data, calculating modification coefficients according to the data accumulations, and modifying the input image data based on the modification coefficients to generate modified image data; and
a data driver generating data voltages corresponding to the modified image data and supplying the data voltages to the plurality of pixels;
wherein the signal controller comprises:
a frame buffer storing buffer data for the plurality of pixels; and
a level encoder modulating the input image data at predetermined intervals so that the modulated image data has one of a predetermined number of levels, adding the modulated image data into previous buffer data stored in the frame buffer to generate current buffer data, and supplying the current buffer data to the frame buffer.

2. The display device of claim 1, wherein the signal controller modulates the input image data so that the modulated image data has one of a predetermined number of levels, and the signal controller accumulates the modulated image data to generate the data accumulations.

3. The display device of claim 2, wherein the signal controller accumulates the modulated image data at predetermined intervals.

4. The display device of claim 1, wherein the signal controller accumulates the input image data at predetermined intervals to generate the data accumulations.

5. The display device of claim 1, wherein the signal controller further comprises a register storing a base value for the data accumulations, and wherein the level encoder subtracts a predetermined level from the buffer data stored in the frame buffer and accumulates a value corresponding to the predetermined level into the base value stored in the register, when the buffer data are equal to or larger than the predetermined level.

6. The display device of claim 5, wherein the signal controller further comprises a level decoder generating the data accumulations based on the buffer data from the frame buffer and the base value from the register.

7. The display device of claim 5, wherein the signal controller farther comprises a frame counter enabling the level encoder at the predetermined intervals.

8. The display device of claim 7, wherein at least one of the frame buffer, the register, and the frame counter comprises a nonvolatile memory.

9. The display device of claim 1, wherein the modification coefficients are predetermined as function of the data accumulations.

10. The display device of claim 9, wherein the signal controller comprises:

a lookup table storing modification variables; and an image signal modifier calculating the modification coefficients based on the modification variables supplied from the lookup table and generating the modified image data based on the modification coefficients.

11. The display device of claim 9, wherein the plurality of pixels represents at least three primary colors and the modification coefficients for the at least three primary colors are independently determined.

12. The display device of claim 1, further comprising a plurality of scanning lines and a plurality of data lines intersecting the scanning lines, wherein each of the plurality of pixels comprises a switching transistor connected to one of the scanning lines and one of the data lines, a capacitor connected to the switching transistor, a driving transistor connected to the switching transistor, and a light emitting element coupled to the driving transistor.

13. The display device of claim 12, wherein the modification coefficients are represented as a function of at least one of a current efficiency of the light emitting element, an electron mobility of the driving transistor, and a threshold voltage of the driving transistor.

* * * * *